(12) United States Patent
Kim et al.

(10) Patent No.: US 8,917,250 B2
(45) Date of Patent: Dec. 23, 2014

(54) TOUCH PANEL

(75) Inventors: Jae Hun Kim, Seoul (KR); Sang Su Hong, Gyunggi-do (KR); Chung Mo Yang, Gyunggi-do (KR); In Hyung Lee, Gyunggi-do (KR); Woo Jin Lee, Seoul (KR); Young Woo Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 293 days.

(21) Appl. No.: 13/312,138

(22) Filed: Dec. 6, 2011

(65) Prior Publication Data
US 2013/0056243 A1 Mar. 7, 2013

(30) Foreign Application Priority Data
Sep. 7, 2011 (KR) .......................... 10-2011-0090812

(51) Int. Cl.
*G06F 3/041* (2006.01)
*H05K 1/02* (2006.01)

(52) U.S. Cl.
CPC .......... *G06F 3/041* (2013.01); *H05K 2201/056* (2013.01); *H05K 1/0289* (2013.01); *G06F 2203/04103* (2013.01); *H05K 2201/0108* (2013.01)
USPC ........................................................ 345/173

(58) Field of Classification Search
CPC ............ G06F 2203/04112; G06F 2203/04113; G06F 3/041; G06F 3/0412; G06F 3/0416; G06F 3/044; G06F 3/047
USPC .................................................. 345/173–183
See application file for complete search history.

(56) References Cited

U.S. PATENT DOCUMENTS

| 6,621,486 | B2 * | 9/2003 | Park et al. ..................... 345/173 |
| 7,920,127 | B2 * | 4/2011 | Takahashi ...................... 345/173 |
| 2006/0221065 | A1 * | 10/2006 | Hong et al. ................... 345/175 |
| 2008/0309623 | A1 * | 12/2008 | Hotelling et al. ............. 345/173 |
| 2009/0201267 | A1 * | 8/2009 | Akimoto et al. ............... 345/173 |
| 2010/0177055 | A1 * | 7/2010 | Ookawara et al. ............ 345/173 |
| 2012/0162099 | A1 * | 6/2012 | Yoo et al. ...................... 345/173 |

* cited by examiner

*Primary Examiner* — Kevin M Nguyen
(74) *Attorney, Agent, or Firm* — Ladas & Parry, LLP

(57) ABSTRACT

Disclosed herein is a structure of an FPC integrated touch panel. According to preferred embodiments of the present invention, a transparent substrate configured of a flexible transparent film is provided and an extension part protruded to the transparent substrate is integrally formed with the transparent substrate, such that a separate FPC needs not to be manufactured, thereby saving process time and manufacturing costs. In addition, the exemplary embodiments of the present invention bend an inactive area unnecessarily occupying an area of the transparent substrate to a side of the touch panel, thereby implementing a touch panel widening a substantial area of an active region.

5 Claims, 12 Drawing Sheets

TOUCH PANEL

CROSS REFERENCE TO RELATED APPLICATION

This application claims the benefit of Korean Patent Application No. 10-2011-0090812, filed on Sep. 7, 2011, entitled "Touch Panel," which is hereby incorporated by reference in its entirety into this application.

BACKGROUND OF THE INVENTION

1. Technical Field

The present invention relates to a touch panel.

2. Description of the Related Art

As a computer using a digital technology is developed, accessory devices of the computer have also been developed. A personal computer, a portable transmission device, and other personal only information processing devices, or the like, perform text and graphic processing using various input devices such as a keyboard, a mouse, or the like.

However, as an information-oriented society is rapidly progressed, a usage of the computer has gradually expanded. It is difficult to efficiently drive products only by the keyboard and the mouse serving as the present input devices. Therefore, a need for devices that are simple and have little malfunction while allowing anyone to easily input information is increased.

In addition, a technology for an input device has been evolved to a technology of high reliability, durability, innovation, design and machining, or the like, including a technology of satisfying general functions. In order to achieve the above objects, a touch panel as an input device capable of inputting information such as text, graphic, or the like, has been developed.

The touch panel is installed on a display surface of a flat panel display, such as an electronic notebook, a liquid crystal display device (LCD), a plasma display panel (PDP), electroluminescence (El), or the like, and an image display device, such as a cathode ray tube (CRT), which is a tool used for a user to select desired information while watching an image display device.

FIG. 1 shows a cross-sectional view of a touch panel according to the prior art and FIG. 2 shows a perspective view of a touch panel shown in FIG. 1. Referring to FIGS. 1 and 2, a touch panel 100 according to the prior art includes transparent substrates 110 and 120, transparent electrodes 115 and 125, and electrode wirings 117 and 127 and further includes an FPC 130. That is, the first transparent electrodes 115 and the second transparent electrodes 125 are formed on surfaces of each of the first transparent substrate 110 and the second transparent substrate 120 that faces each other are provided with and the first electrode wirings 117 electrically connected to the first transparent electrodes 115 are formed at edges of the first transparent electrodes 115 and the second electrode wirings 127 electrically connected to the second transparent electrodes 125 are formed at edges of the second transparent electrodes 125. The first electrode wirings 117 and the second electrode wirings 127 are concentrated on side ends of the transparent substrates 110 and 120 and the separately disposed FPC 130 is connected to the first electrode wirings 117 and the second electrode wirings 127 and transmits electrical signals to a controller (not shown).

The transparent substrates 110 and 120 configuring the touch panel 100 according to the prior art are partitioned into an active region in which the transparent electrodes 115 and 125 are formed and an inactive region in which the electrode wirings 117 and 127 are formed. The transparent electrodes 115 and 125 are configured to serve to sense a touch input position of a user. In order to more accurately sense the touch position, there is a need to densely dispose the transparent electrodes 115 and 125 that are formed in a predetermined area of the active region. Therefore, the number of electrode wirings 117 and 127 electrically connected to the transparent electrodes 115 and 125 is also increased, such that an area occupied by the inactive region may unnecessarily extend in the transparent substrates 110 and 120.

Meanwhile, a demand for a transparent conductive layer material has also increased with a sudden expansion of a thin display field business, centering around an LCD. As the transparent conductive layer material, indium tin oxide (ITO) has been mainly used. When considering the rising demand for applications due to excellent characteristics of the ITO as a transparent electrode, it is expected that the consumption of the material is gradually increased in the future. However, indium forming ITO is a representative one of scarce and depleting resources and the supply thereof is greatly reduced. According to the specialist, it is expected that the indium is fully exhausted from about 10 to about 25 years. The indium needs to be purified using by-products of a zinc ore, which also leads to high scarcity. Even before the indium is depleted, the sudden rise in indium price leads to increase manufacturing costs of applications. Therefore, a development of a new transparent conductive layer that does not include the indium is very urgently needed.

SUMMARY OF THE INVENTION

The present invention has been made in an effort to provide a touch panel including a transparent substrate to which a flexible transparent film is applied to increase a substantial area of an active region by bending an inactive region unnecessarily occupying an area of the transparent substrate to a side of the touch panel. In addition, the present invention has been made in an effort to provide a touch panel capable of removing a depletion problem of resources used for a transparent conductive film by replacing ITO used for a transparent electrode so as to form a metal electrode configured of a metal film.

According to a first preferred embodiment of the present invention, there is provided a touch panel, including: a first transparent substrate; a first extension part extending to be protruded from one side of the first transparent substrate so as to be integrally formed with the first transparent substrate; a first metal electrode formed on one surface of the first transparent substrate; a first electrode wiring extending from the first metal electrode so as to be formed on the first transparent substrate and the first extension part; a second transparent substrate facing the first transparent substrate; a second extension part extending to be protruded from one side of the second transparent substrate so as to be integrally formed with the second transparent substrate; a second metal electrode formed on one surface of the second transparent substrate; and a second electrode wiring extending from the second metal electrode so as to be formed on the second transparent substrate and the second extension part, wherein the first transparent substrate is divided into an active region and an inactive region and is bent at a boundary line between the active region and the inactive region of the first transparent substrate so that the inactive region of the first transparent substrate and the first extension part are vertically disposed to the active region of the first transparent substrate, and the second transparent substrate is divided into an active region and an inactive region and is bent at a boundary line between the active region and the inactive region of the second transparent substrate so that the inactive region of the second transparent substrate and the first extension part are vertically disposed to the active region of the second transparent substrate.

The touch panel may further include a controller, wherein the controller may be connected to the first electrode wiring formed on the first extension part and the second electrode wiring formed on the second extension part.

The first transparent substrate and the first extension part and the second transparent substrate and the second extension part may be configured of a flexible transparent film.

The first metal electrode may be formed in the active region of the first transparent substrate so that straight electrode lines are repeatedly disposed in parallel in one direction and the second metal electrode may be formed in the active region of the second transparent substrate so that straight electrode lines formed in a direction vertical to the first metal electrode are repeatedly disposed in parallel.

The touch panel may further include an adhesive layer bonding the other surface of the first transparent substrate to one surface of the second transparent substrate.

A protruding direction of the first extension part may be orthogonal to a protrusion direction of the second extension part.

The first metal electrode or the second metal electrode may be a metal mesh electrode.

According to a second preferred embodiment of the present invention, there is provided a touch panel, including: a transparent substrate; a first extension part extending to be protruded from one side of the transparent substrate so as to be integrally formed with the transparent substrate; a first metal electrode formed on one surface of the first transparent substrate; a first electrode wiring extending from the first metal electrode so as to be formed on one surface of the transparent substrate and the first extension part; a second extension part extending to be protruded from the other side of the transparent substrate so as to be integrally formed with the transparent substrate; a second metal electrode formed on the other surface of the transparent substrate; and a second electrode wiring extending from the second metal electrode so as to be formed on the other surface of the transparent substrate and the second extension part.

The one surface of the first transparent substrate may be divided into a first active region and a first inactive region and may be bent at a boundary line between the first active region and the first inactive region so that the first inactive region and the first extension part are vertically disposed to the first active region of the transparent substrate and the other surface of the transparent substrate may be divided into a second active region and a second inactive region, the second active region corresponding to the first active region, and may be bent at a boundary line between the second active region and the second inactive region so that the second inactive region and the second extension part are vertically disposed to the second active region of the transparent substrate.

The touch panel may further include a controller, wherein the controller may be connected to the first electrode wiring formed on the first extension part and the second electrode wiring formed on the second extension part.

The transparent substrate, the first extension part, and the second extension part may be configured of a flexible transparent film.

The transparent substrate, the first extension part, and the second extension part may be configured of a flexible transparent film.

The first metal electrode may be formed in the first active region of the transparent substrate so that straight electrode lines are repeatedly disposed in parallel in one direction and the second metal electrode may be formed in the second active region of the transparent substrate so that straight electrode lines formed in a direction vertical to the metal electrode are repeatedly disposed in parallel.

The first metal electrode or the second metal electrode may be a metal mesh electrode.

According to a third preferred embodiment of the present invention, there is provided a touch panel, including: a transparent substrate; an extension part extending to be protruded from one side of the transparent substrate so as to be integrally formed with the transparent substrate; metal electrode formed on one surface of the transparent substrate, and an electrode wiring extending from the metal electrode so as to be formed on the first transparent substrate and the extension part, wherein the transparent substrate is divided into an active region and an inactive region and is bent at a boundary line between the active region and the inactive region of the transparent substrate so that the inactive region of the transparent substrate and the extension part are vertically disposed to the active region of the transparent substrate.

The transparent substrate may be configured of a flexible transparent film.

The metal electrode may be a metal mesh electrode.

DESCRIPTION OF THE PREFERRED EMBODIMENTS

Figure 1:
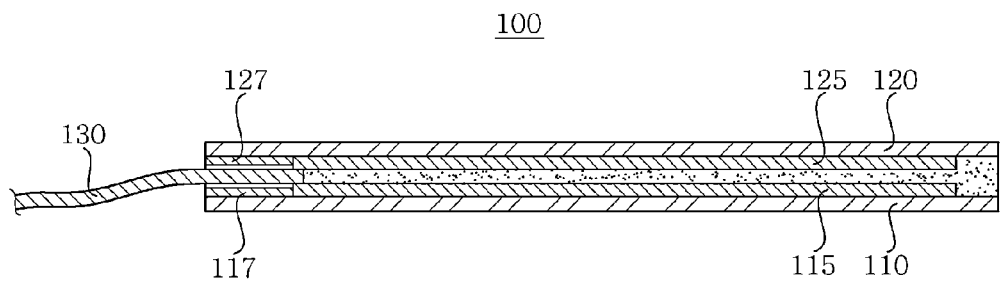
FIG. 1 is a cross-sectional view of a touch panel according to the prior art.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Various objects, advantages and features of the invention will become apparent from the following description of embodiments with reference to the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

First Preferred Embodiment

Figure 3A:
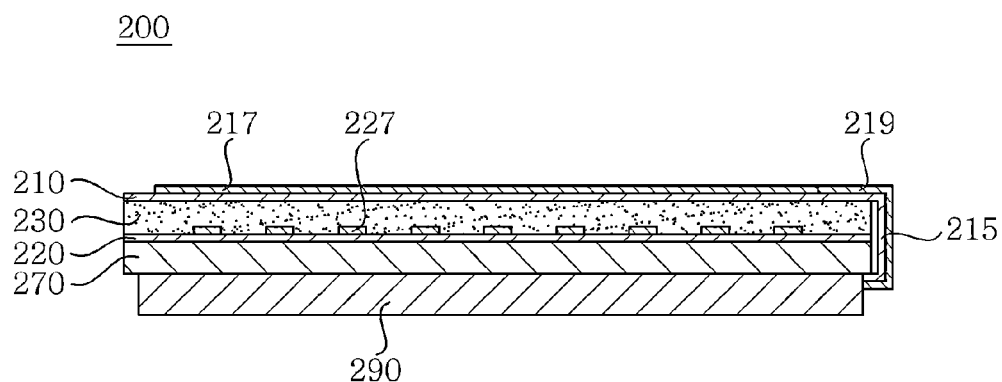
FIG. 3A is a cross-sectional view of the touch panel according to a first preferred embodiment of the present invention.
Figure 3B:
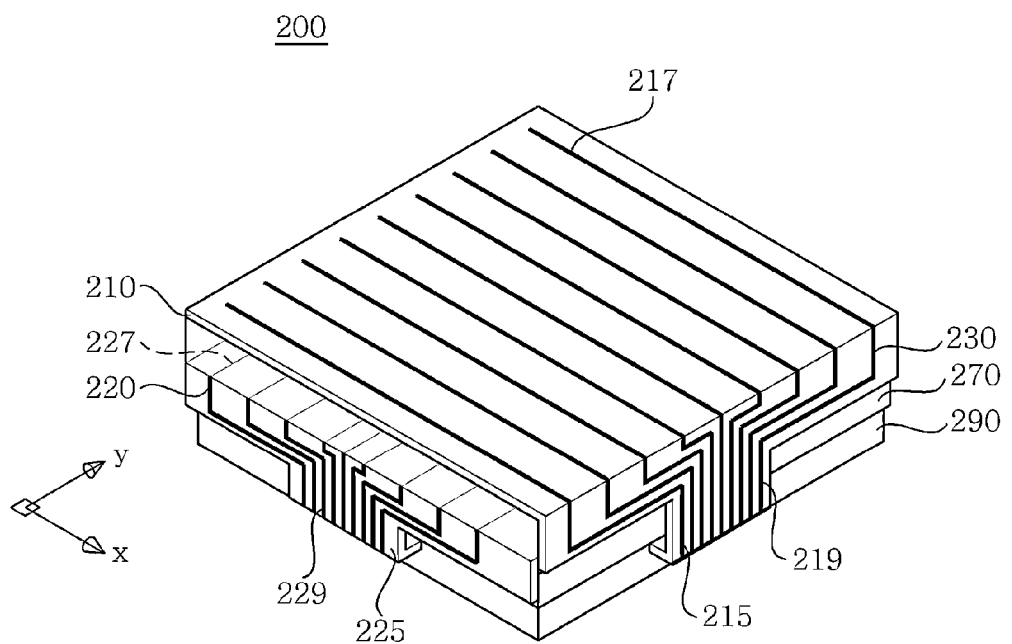
FIG. 3B is a perspective view of the touch panel according to the FIG. 3A.
Figure 4A:
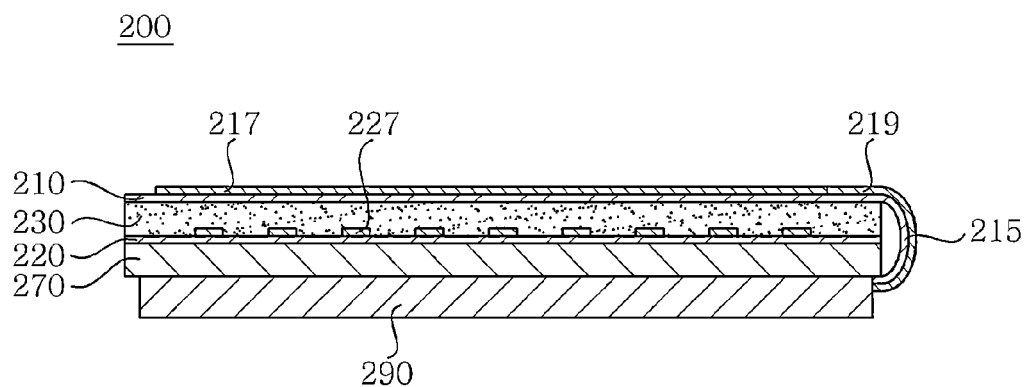
FIG. 4A is a cross-sectional view of the touch panel according to another first preferred embodiment of the present invention.
Figure 4B:
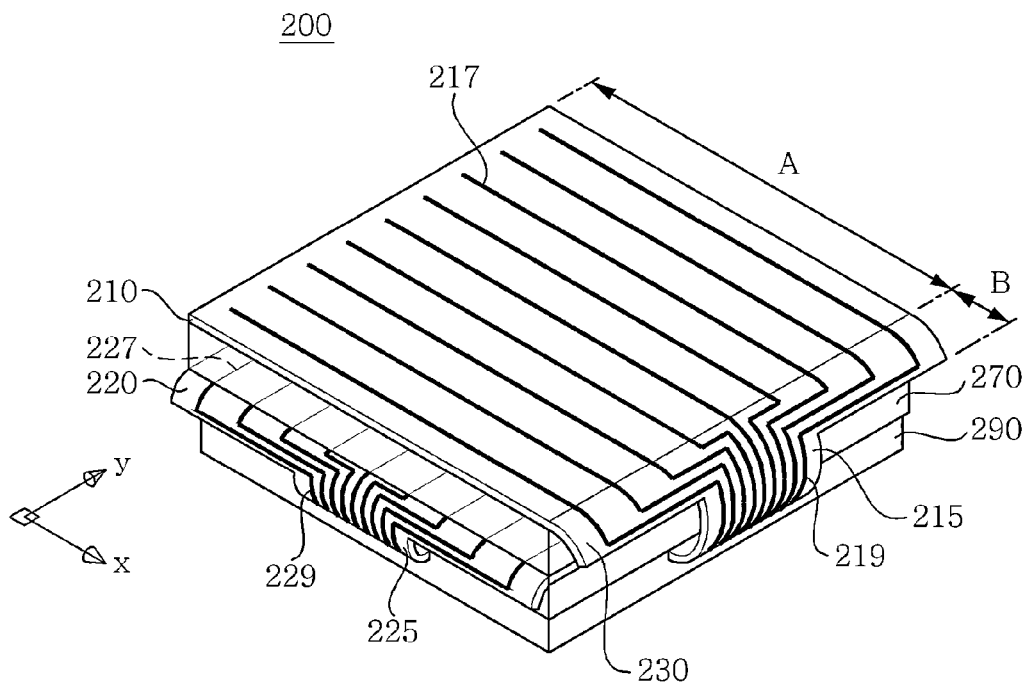
FIG. 4B is a perspective view of the touch panel according to the FIG. 4A.

FIGS. 3A and 3B show a touch panel 200 according to a first preferred embodiment of the present invention and FIGS. 4A and 4B show a touch panel 200 according to another first preferred embodiment of the present invention. The touch panel 200 according to the first preferred embodiment of the present invention is configured to include a first transparent substrate 210 and a second transparent substrate 220 formed to face the first transparent substrate 210, a first extension part 215 extending from the first transparent substrate 210 so as to be integrally formed with the first transparent substrate 210, a second extension part 225 extending from the second transparent substrate 220 so as to be integrally formed with the second transparent substrate 220, and metal electrodes (first metal electrodes 217 and second metal electrodes 227) formed on the transparent substrates (the first transparent substrate 210 and the second transparent substrate 220) and electrode wirings (first electrode wirings 219 and second electrode wirings 229).

Figure 5A:
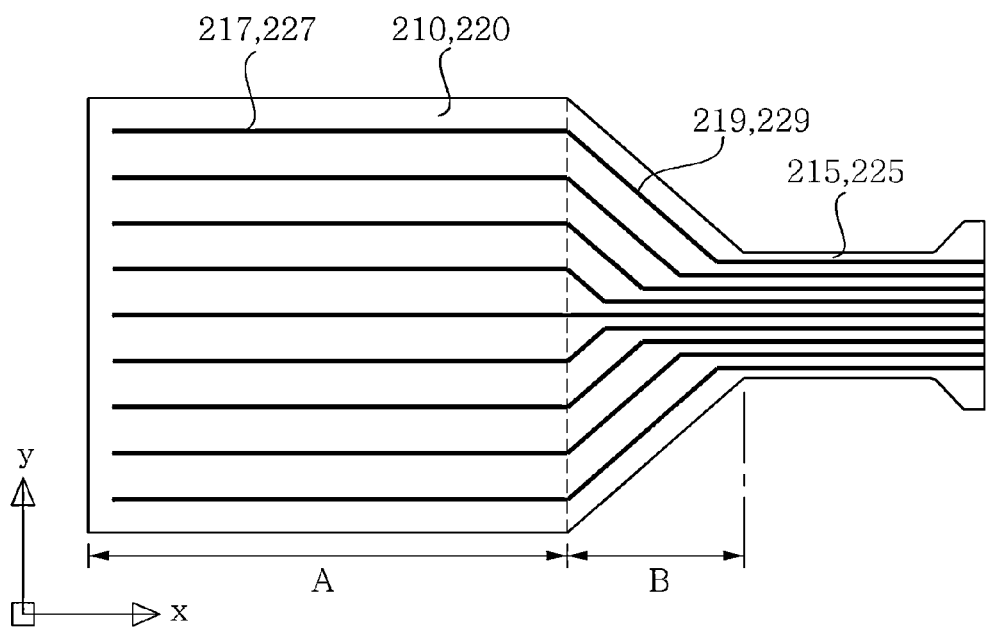
FIG. 5A is a plan view and a perspective view of a transparent substrate configuring the touch panel of FIGS. 3A and 3B.
Figure 5A:
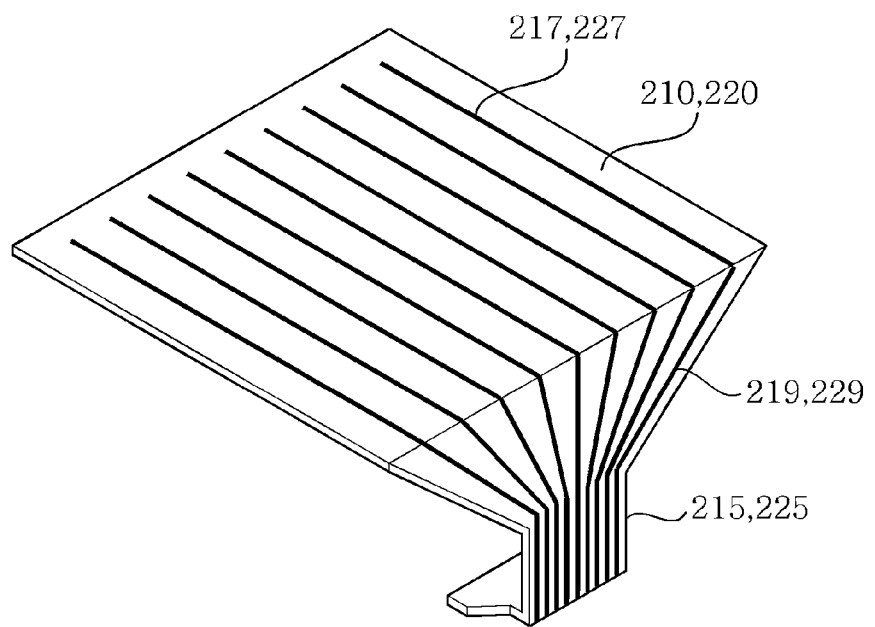
Figure 5B:
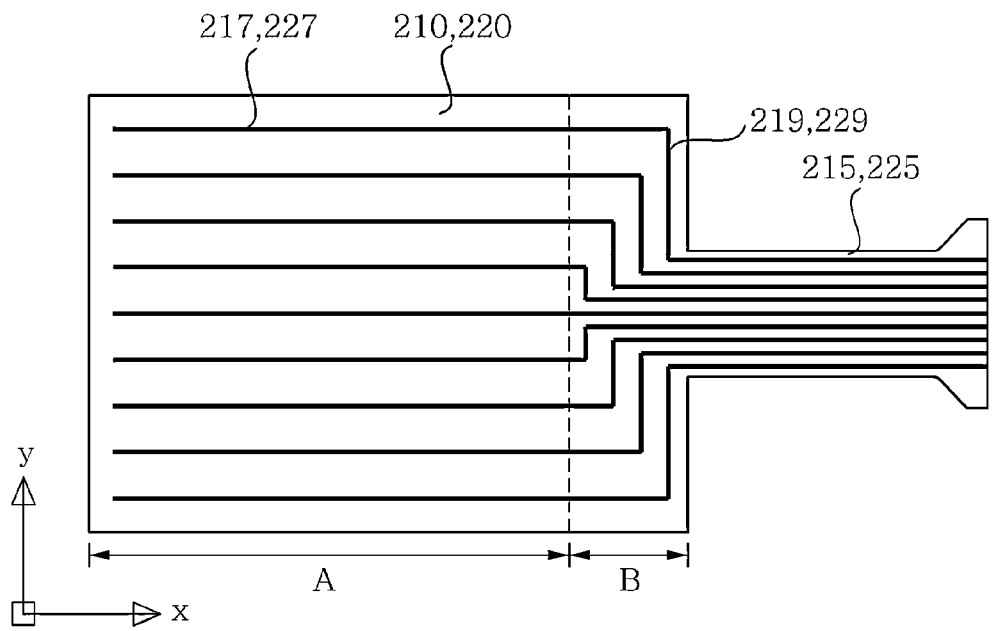
FIG. 5B is a plan view and a perspective view of another transparent substrate configuring the touch panel of FIGS. 3A and 3B.
Figure 5B:
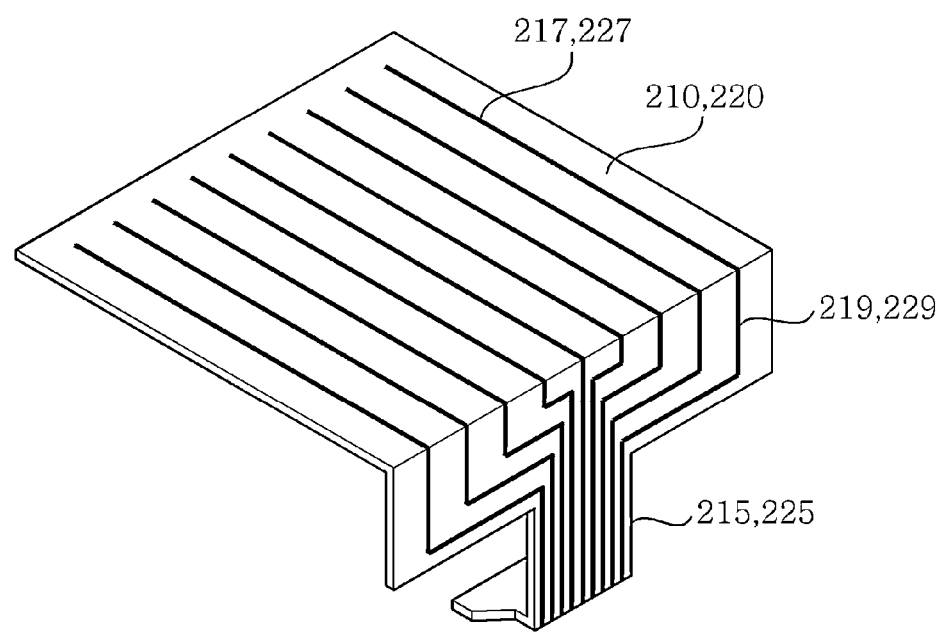

Referring to FIGS. 5A and 5B, the transparent substrates 210 and 220 serve to provide a region in which the metal electrodes 217 and 227 and the electrode wirings 219 and 229 are formed (see FIG. 5). The first transparent substrate 210 is divided into an active region A and an inactive region B, wherein the active region A is a part in which the first metal electrodes 217 are formed so as to recognize a touch of the input unit and occupies most of the first transparent substrate 210 and the inactive region B is a part in which the first electrode wirings 219 extending from the first metal electrodes 217 are formed and is formed on one side of the first transparent substrate 210. The second transparent substrate 220 is divided into an active region A and an inactive region B, wherein the active region A is a part in which the second metal electrodes 227 are formed so as to recognize a touch of the input unit and occupies most of the second transparent substrate 220 and the inactive region B is a part in which the second electrode wirings 229 extending from the second metal electrodes 227 are formed and is formed on one side of the second transparent substrate 220. The first metal electrodes 217 and the first electrode wirings 219 are formed on one surface of the first transparent substrate 210 and the second metal electrodes 227 and the second electrode wirings 229 are formed on one surface of the second transparent substrate 220, the touch panel 200 is configured so that the other surface of the first transparent substrate 210 faces one surface of the second transparent substrate 220. In this configuration, an adhesive layer 230 (see FIGS. 3A and 3B) bonding both transparent substrates 210 and 220 to each other may be further formed between the other surface of the first transparent substrate 210 and one surface of the second transparent substrate 220.

Meanwhile, the transparent substrates 210 and 220 configuring the touch panel 200 according to the preferred embodiment of the present invention include the protruded extension parts 215 and 225 and the transparent substrates 210 and 220 are configured of a flexible transparent film.

Figure 2:
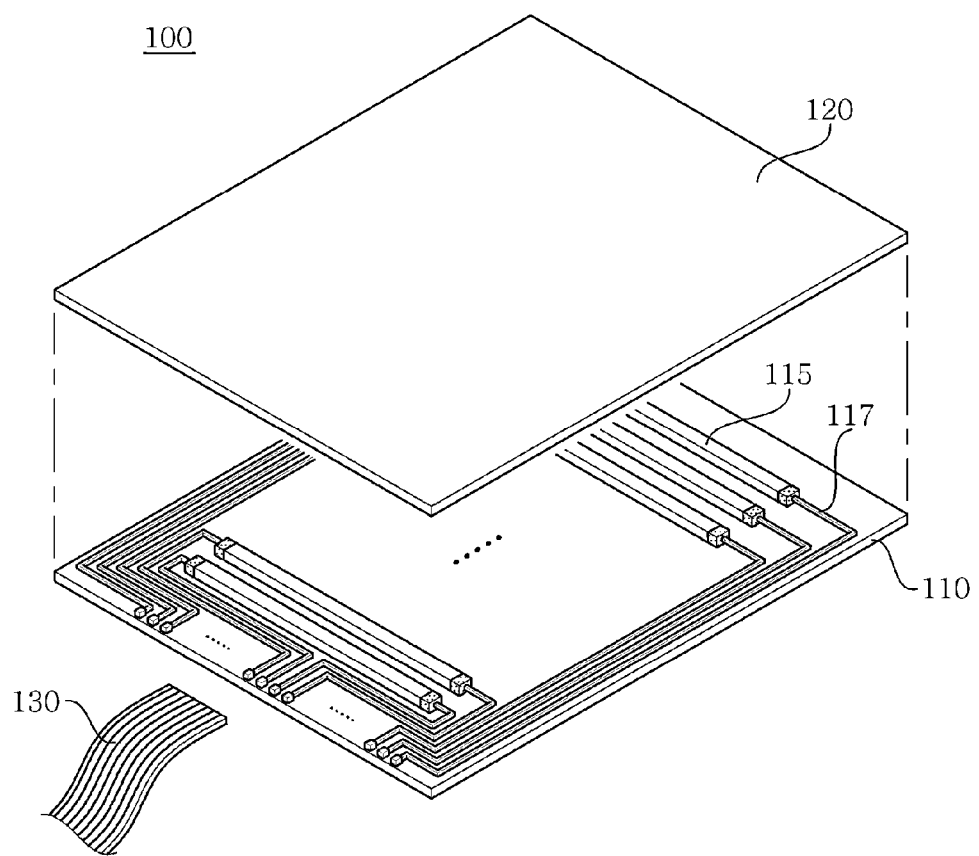
FIG. 2 is a perspective view of the touch panel of FIG. 1.

First, the transparent substrates 210 and 220 include the extension parts 215 and 225 that are protruded from the inactive region B so as to be integrally formed with the transparent substrates 210 and 220. That is, the first transparent substrate 210 includes the first extension part 215 that is protruded from the inactive region B so as to be integrally formed with the first transparent substrate 210 and the second transparent substrate 220 includes the second extension part 225 that is protruded from the inactive region B so as to be integrally formed with the second transparent substrate 220. The first extension part 215 and the second extension part 225 are configured to correspond to an FPC 130 (see FIGS. 1 and 2) connecting the touch panel to the controller, in the touch panel (see FIGS. 1 and 2) according to the prior art. The transparent substrates 210 and 220 are manufactured using the flexible transparent film as a fundamental material and provides the FPC integrated touch panel 200 by integrally forming the extension parts 215 and 225 corresponding to the FPC according to the prior art with the transparent substrates 210 and 220. As described below, in the touch panel 200, the first metal electrodes 217 formed on the first transparent substrate 210 are orthogonal to the second metal electrodes 227 formed on the second transparent substrate 220, such that a direction in which the first extension part 215 is protruded from the first transparent substrate 210 and a direction in which the second extension 225 is protruded from the second transparent substrate 220 forms 90° with respect to each other (see FIGS. 3A and 3B).

Next, the transparent substrates 210 and 220 are configured of a flexible transparent film. The flexible transparent film has a function of an insulating material and has excellent flexibility. Therefore, a predetermined degree of freedom is provided to the inactive region B and the extension parts 215 and 225. As the materials for the flexible transparent film, polyimide is preferable. However, the exemplary embodiment of the present invention may use any material without being limited if the materials for the flexible transparent film are the insulating materials having excellent flexibility.

The transparent substrates 210 and 220 may be modified into various three-dimensional shapes due to the above-mentioned two characteristics. Representatively, as shown in FIGS. 3A and 3B, transparent substrates 210 and 220 are bent at a boundary line between the active region A and the inactive region B of the transparent substrates 210 and 220 so that the inactive region B may be vertical to the active region A or as shown in FIGS. 4A and 4B, the transparent substrates 210 and 220 are bent the boundary line between the active region A and the inactive region B of the transparent substrates 210 and 220 so that the inactive region B and the extension parts 215 and 225 may be smoothly curved. With reference to both of the modification examples, in a top of the touch panel 200, only the active region A of the first transparent substrate 210 is occupies user vision, while the inactive region B unnecessarily occupying the area of the transparent substrate due to the electrode wirings 219 and 229 formed in the inactive region B encloses a side portion of the touch panel 200. That is, it is possible to use the wider active region A.

The metal electrodes 217 and 227 serve to allow an input unit to generate signals at the time of touch so as for the controller to recognize touched coordinates and are formed on one surface of the transparent substrates 210 and 220. In the exemplary embodiment of the present invention, the metal electrode formed on one surface of the first transparent substrate 210 is named as the first metal electrode 217 and the metal electrode formed on one surface of the second transparent substrate 220 is named as the second metal electrode 227. The metal electrodes may be formed by generally forming a thin film on the transparent substrate using a dry process, such as sputtering, evaporation, or the like, or a wet process such as dip coating, spin coating, roll coating, spray coating, or the like, and then, selectively etching the thin film or by using a direct patterning process, such as a screen printing method, a gravure printing method, an inkjet printing method, or the like.

Meanwhile, edges of the first metal electrodes 217 and the second metal electrodes 227 are provided with the first electrode wirings 219 receiving electrical signals from the first metal electrodes 217 and the second electrode wirings 229 receiving electrical signals from the second metal electrodes 227. In this configuration, the electrode wirings 219 and 229 may be printed using the screen printing method, the gravure printing method, the inkjet printing method, or the like. In addition, as the materials for the electrode wirings 219 and 229, silver paste (Ag paste) having excellent electric conductivity or materials composed of organic silver may be used. However, the exemplary embodiment of the present invention is not limited thereto and therefore, a conductive polymer or low-resistance metal of metal oxides or metals such as carbon black (including CNT), or the like, may be used. Meanwhile, when the electrode wirings 219 and 229 are made of the same metal as the metal electrodes 217 and 227, the metal electrodes 217 and 227 and the electrode wirings 219 and 229 may be simultaneously formed on the transparent substrates 210 and 220.

Meanwhile, as shown in FIG. 5, the first metal electrodes 217 are formed in the active region A of the first transparent substrate 210 and individual metal electrode lines configuring the first metal electrodes 217 may be formed so as to face the first extension part 215. In other words, the first metal electrode 217 is configured so that the metal electrode lines disposed so as to be parallel with an x axis are disposed so as to be parallel with a y-axis direction. Meanwhile, the first electrode wirings 219 electrically connected to the first metal electrodes 217 are formed in the inactive region B and are concentrated at the boundary between the inactive region B and the first extension part 215 so as to extend to the first extension part 215. The first transparent substrate 210 is configured of the flexible transparent film and thus, may be easily bent and may be flexible. In the exemplary embodiment of the present invention, the first transparent substrate 210 is bent at the boundary line between the active region A and the inactive region B of the first transparent substrate 210. The first electrode wiring 219 formed in the inactive region B encloses the side portion of the touch panel 200 and the first extension part 215 extending to be protruded from the inactive region B faces the controller 290 (see FIGS. 3A and 3B) provided on the touch panel 200 and is connected to a printed circuit board (not shown) formed in the controller 290.

Similarly, the second metal electrodes 227 are formed in the active region A of the second transparent substrate 220 and individual metal electrode lines configuring the second metal electrodes 227 may be formed so as to face the second extension part 225. In other words, the second metal electrode 227 is configured so that the metal electrode lines disposed so as to be parallel with a y axis are disposed so as to be parallel with an x-axis direction. Meanwhile, the second electrode wirings 229 electrically connected to the second metal electrodes 227 are formed in the inactive region B and are concentrated at the boundary between the inactive region B and the second extension part 225 so as to extend to the second extension part 225. The second transparent substrate 210 is configured of the flexible transparent film and thus, may be easily bent and may be flexible. In the exemplary embodiment of the present invention, the second transparent substrate 220 is bent at the boundary line between the active region A and the inactive region B of the second transparent substrate 220. The second electrode wirings 229 formed in the inactive region B encloses the side portion of the touch panel 200 and the second extension part 225 extending to be protruded from the inactive region B faces the controller 290 (see FIGS. 3A and 3B) provided on the touch panel 200 and is connected to the printed circuit board (not shown) formed in the controller 290.

In the exemplary embodiment of the present invention, since the directions of forming the first metal electrode 217 and the second metal electrode 227 are vertical to each other and the first metal electrode 217 and the second metal electrode 227 each face the first extension part 215 and the second extension part 225, the protruding direction of the first extension part 215 extending from the first transparent substrate 210 and the protruding direction of the second extension part 225 extending from the second transparent substrate 220 also form 90° with respect to each other.

An image display device 270 (see FIGS. 3A and 3B) is attached to the other surface of the second transparent substrate 220 and the second transparent substrate 220 may be bonded to the image display device 270 by using an adhesive member (not shown). The image display device 270 serves to output images and includes a liquid crystal display device (LCD), a plasma display panel (PDP), an electroluminescence (EL), a cathode ray tube (CRT), or the like. In addition, as the adhesive member (not shown), a transparent material so as not to hinder the user from recognizing the images output from the image display device 270 may be used. For example, an optical clear adhesive (OCA) may be used.

Second Preferred Embodiment

Figure 6A:
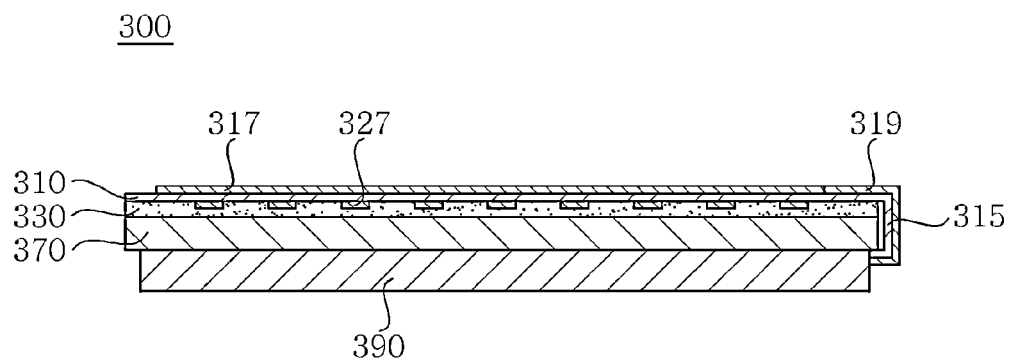
FIG. 6A is a cross-sectional view of a touch panel according to a second preferred embodiment of the present invention.
Figure 6B:
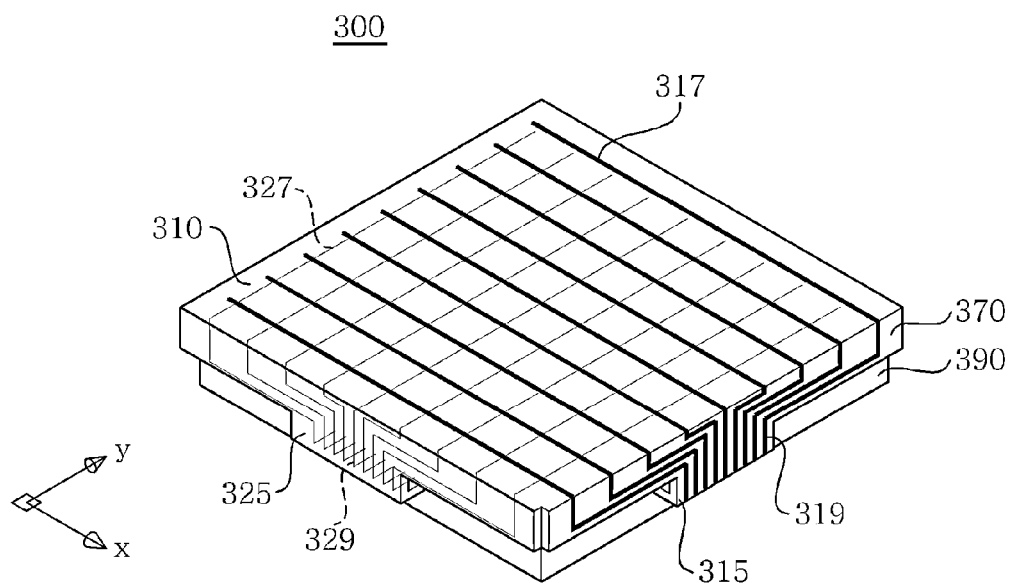
FIG. 6B is a perspective view of the touch panel according to the FIG. 6A.
Figure 7A:
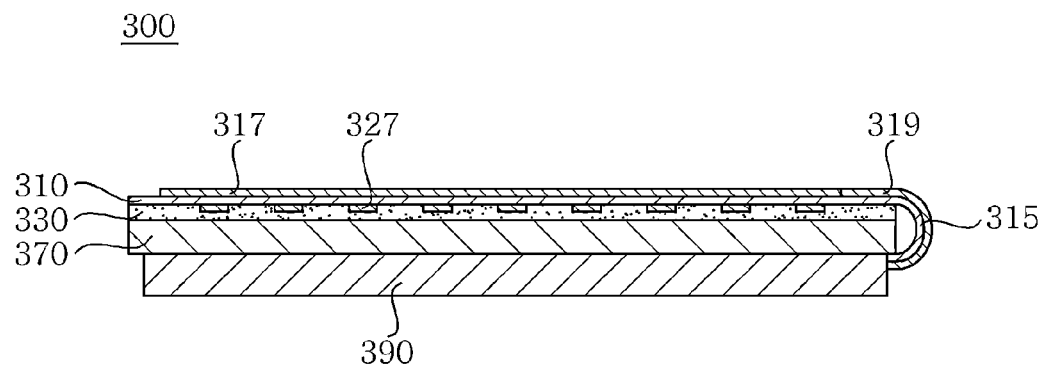
FIG. 7A is a cross-sectional view of a touch panel according to another second preferred embodiment of the present invention.
Figure 7B:
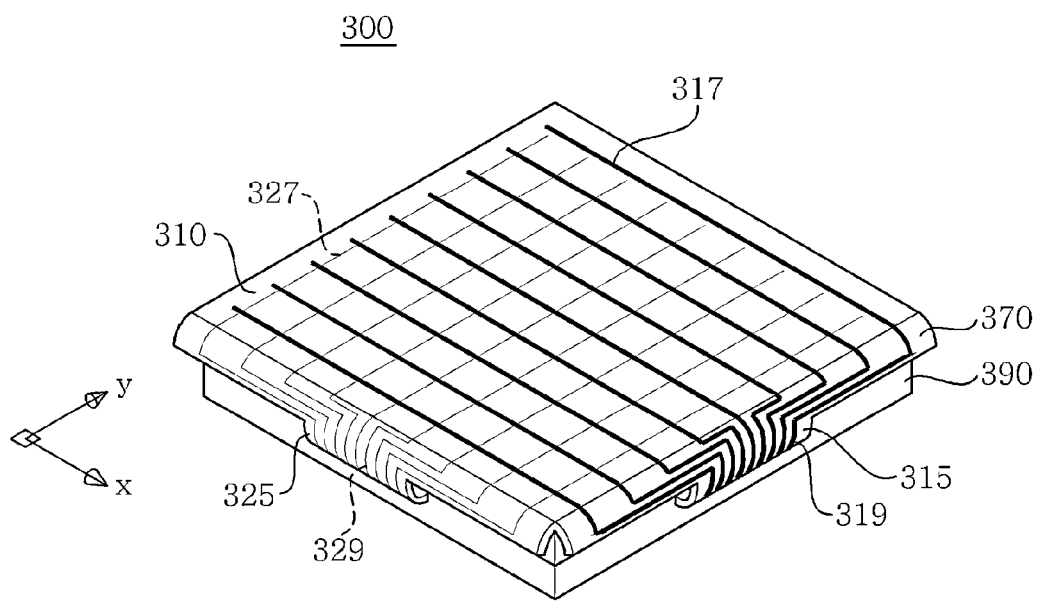
FIG. 7B is a perspective view of the touch panel according to the FIG. 7A.

FIGS. 6A and 6B show a touch panel according to a second preferred embodiment of the present invention and FIGS. 7A and 7B show a touch panel according to another second preferred embodiment of the present invention. Unlike the first preferred embodiment of the present invention, in the second preferred embodiment of the present invention, a single transparent substrate 310 is provided and metal electrodes 317 and 327 are formed on both surfaces of the transparent substrate 310. That is, a touch panel 300 according to the second exemplary embodiment of the present invention is configured to include a transparent substrate 310, a first extension part 315 and a second extension part 325 extending from the transparent substrate 310 so as to be integrally formed with the transparent substrate 310, first metal electrodes 317 and second metal electrodes 327 formed on both surfaces of the transparent substrate 310, and first electrode wirings 310 and second electrode wirings 329 connected to the metal electrodes 317 and 327.

Figure 8A:
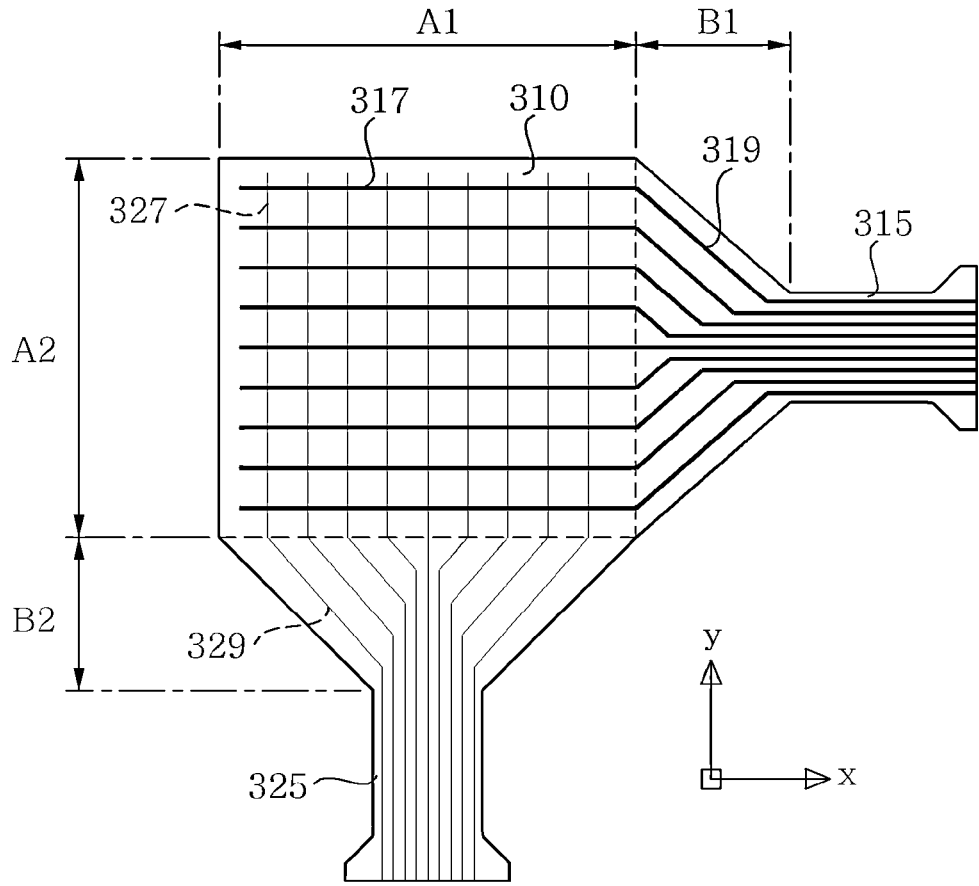
FIG. 8A is a plan view and a perspective view of a transparent substrate configuring the touch panel of FIGS. 6A and 6B.
Figure 8A:
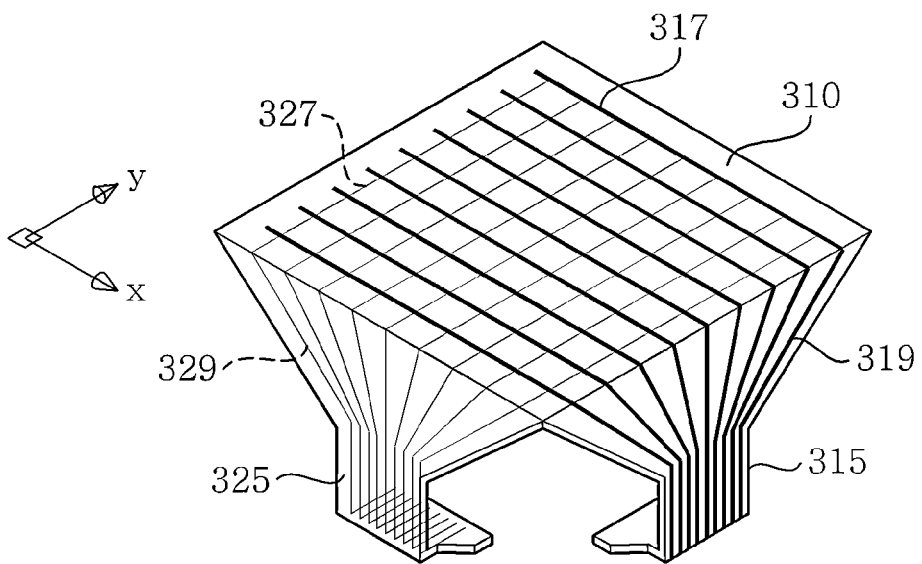
Figure 8B:
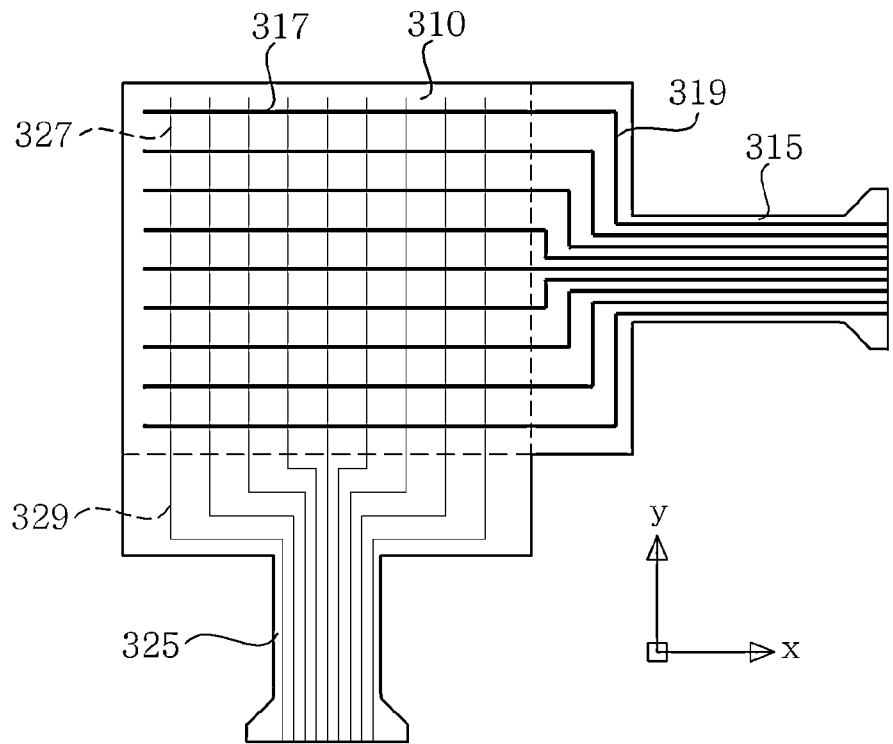
FIG. 8B is a plan view and a perspective view of another transparent substrate configuring the touch panel of FIGS. 6A and 6B.
Figure 8B:
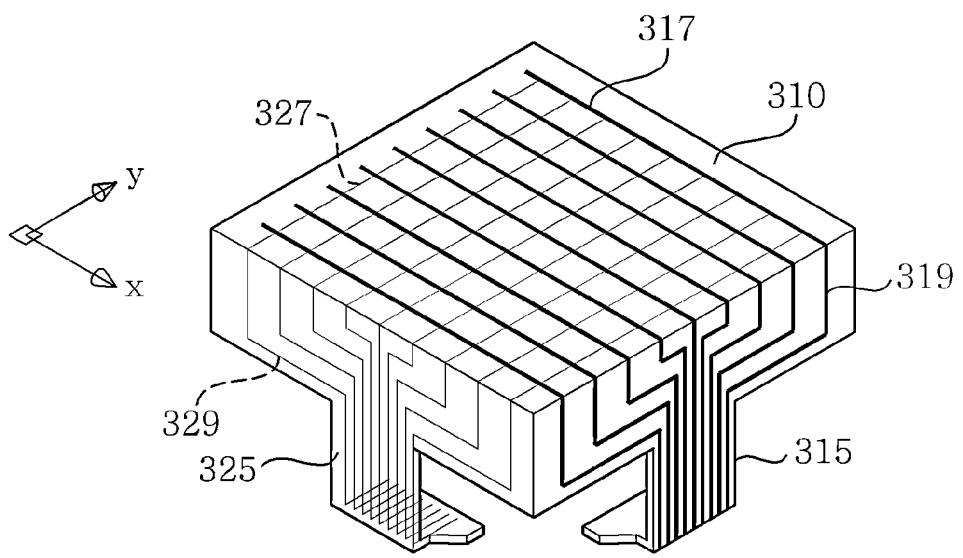

Referring to FIGS. 8A and 8B, the transparent substrates 310 serve to provide a region in which the metal electrodes 317 and 327 and the electrode wirings 319 and 329 are formed. One surface of the transparent substrate 310 is divided into a first active regions A and a first inactive region B1 and the other surface thereof is divided into a second active region A2 and a second inactive region B2. The first active region A1 and the second active region A2 are formed at a position corresponding to each other and the first inactive region B1 and the second inactive region B2 are disposed to intersect with each other by 90°. For example, when the first inactive region B1 is disposed at any one of the left and right (an x axis on FIGS. 8A an 8B) of the first active region A1, the second inactive region B2 is disposed at any one of the top and bottom (a y axis on FIGS. 8A and 8B) of the second active region A2.

Meanwhile, similarly to the first preferred embodiment, the transparent substrate 310 configuring the touch panel 300 of the exemplary embodiment of the present invention includes a pair of protruded extension parts (the first extension part 315 and the second extension part 325) and the transparent substrate 310 is configured of the flexible transparent film.

First, the transparent substrate 310 includes the first extension part 315 protruded from the first inactive region B1 of one surface thereof so as to be integrally formed with the transparent substrate 310 and the second extension part 325 protruded from the second inactive region B2 the other surface thereof so as to be integrally formed with the transparent substrate 310. As described above, since the first inactive region B1 and the second inactive region B2 are disposed to intersect with each other by 90° based on the first active region A1 and the second active region A2 corresponding to each other, the extension parts 315 and 325 protruded to extend from these inactive regions B1 and B2 also form 90° on an x-y plane based on the active regions A1 and A2.

Next, the transparent substrate 310 is configured of the flexible transparent film. The detailed description thereof is the same as the corresponding portions of the first preferred embodiment and therefore, the repeated description thereof will be omitted.

The transparent substrate 310 may be modified into various three-dimensional shapes due to the above-mentioned two characteristics. Representatively, as shown in FIGS. 6A and 6B, the transparent substrate 310 is bent at the boundary line between the first active region A1 and the first inactive region B1 of the transparent substrate 310 so that the first inactive region B1 may be vertical to the first active region A1 and the transparent substrate 310 is bent at the boundary line between the second active region A2 and the second inactive region B2 of the transparent substrate 310 so that the second inactive region B2 and the second active region A2 may be vertically bent to each other. In addition, as shown in FIGS. 7A and 7B, the transparent substrate 310 is bent at the boundary line between the first active region A1 and the first inactive region B1 of the transparent substrate 310 so that the first inactive region B1 and the first extension part 315 may be smoothly curved and the transparent substrate 310 is bent from boundary line between the second active region A2 and the second inactive region B2 of the transparent substrate 310 so that the second inactive region B2 and the second extension part 325 may be smoothly curved. In both of the modified examples, in a top of the touch panel 300, only the first active region A1 (or the second active region A2) of the transparent substrate 310 occupies the user's vision, while the inactive region (the first inactive region B1 and the second inactive region B2) unnecessary occupying an area of the transparent substrate 310 due to the electrode wirings 319 and 329 formed in the inactive region encloses the side portion of the touch panel 300. That is, it is possible to use the wider active regions A1 and A2.

The metal electrodes 317 and 327 serve to allow the input unit to generate signals at the time of touch so as for the controller to recognize touched coordinates and are formed on both surfaces of the transparent substrates 310. In the exemplary embodiment of the present invention, the first metal electrode formed on one surface of the transparent substrate 310 is named as the first metal electrode 317 and the metal electrode formed on the other surface of the transparent substrate 310 is named as the second metal electrode 327. A method for forming the metal electrodes 317 and 327 is the same as the corresponding portion of the above-mentioned first preferred embodiment.

Edges of the first metal electrode 317 and the second metal electrode 327 are provided with the first electrode wiring 319 receiving electrical signals from the first metal electrode 317 and the second electrode wiring 329 receiving electrical signals from the second metal electrode 327. In this configuration, the electrode wirings 319 and 329 may be printed using the screen printing method, the gravure printing method, the inkjet printing method, or the like. In addition, as the materials for the electrode wirings 319 and 329, silver paste (Ag paste) having excellent electric conductivity or materials composed of organic silver may be used. However, the exemplary embodiment of the present invention is not limited thereto and therefore, a conductive polymer, a metal oxide such as carbon black (including CNT), or a low-resistance metal such as metals, or the like, may be used. Meanwhile, when the electrode wirings 319 and 329 are made of the same metal as the metal electrodes 317 and 327, the metal electrodes 317 and 327 and the electrode wirings 319 and 329 may be simultaneously formed on the transparent substrate 310.

As shown in FIGS. 8A and 8B, the first metal electrode 317 is formed in the first active region A1 of the transparent substrate 310 and individual metal electrode lines configuring the first metal electrode 317 may be formed to face the first extension part 315. In other words, the first metal electrode 317 is configured so that the metal electrode lines disposed so as to be parallel with an x axis are disposed so as to be parallel with a y-axis direction. Meanwhile, the first electrode wirings 319 electrically connected to the first metal electrodes 317 are formed in the first inactive region B1 and are concentrated at the boundary between the first inactive region B1 and the first extension part 315 so as to extend to the first extension part 315. Similarly, the second metal electrodes 327 are formed in the second active region A2 of the transparent substrate 310 and individual metal electrode lines configuring the second metal electrodes 327 may be formed so as to face the second extension part 325. In other words, the second metal electrode 327 is configured so that the metal electrode lines disposed so as to be parallel with a y axis are disposed so as to be parallel with an x-axis direction. Meanwhile, the second electrode wirings 329 electrically connected to the second metal electrodes 327 are formed in the second inactive region B2 and are concentrated at the boundary between the second inactive region B2 and the second extension part 325 so as to extend to the second extension part 325.

The transparent substrate 310 is configured of the flexible transparent film and thus, may be easily bent and may be flexible. In the exemplary embodiment of the present invention, the transparent substrate 310 is bent at the boundary line between the first active region A1 and the first inactive region B1 of the transparent substrate 310. The first electrode wiring 319 formed in the first inactive region B1 encloses the side portion of the touch panel 300 and the first extension part 315 extending to be protruded from the first inactive region B1 faces the controller 390 (see FIGS. 6A and 6B) provided on the touch panel 300 and is connected to a printed circuit board (not shown) formed in the controller 390. In addition, the transparent substrate 310 is bent at the boundary line between the second active region A2 and the second inactive region B2 of the transparent substrate 310. The second electrode wiring 329 formed in the second inactive region B2 encloses the side portion of the touch panel 300 and the second extension part 325 extending to be protruded from the second inactive region B2 faces the controller 390 (see FIGS. 6A and 6B) provided on the touch panel 300 and is connected to a printed circuit board (not shown) formed in the controller 390.

In the exemplary embodiment of the present invention, since the directions of forming the first metal electrode 317 and the second metal electrode 327 are vertical to each other and the first metal electrode 317 and the second metal electrode 327 each face the first extension part 315 and the second extension part 325, the protruding direction of the first extension part 315 and the protruding direction of the second extension part 325 extending from the transparent substrate 310 also form 90° with respect to each other.

The image display device 370 is attached to the other surface of the transparent substrate 310 and the transparent substrate 310 may be bonded to the image display device 370 by using the adhesive member (not shown). The detailed description of the image display device 370 and the adhesive member (not shown) are repeated with the first preferred embodiment and therefore, will be omitted.

Third Preferred Embodiment

Figure 9A:
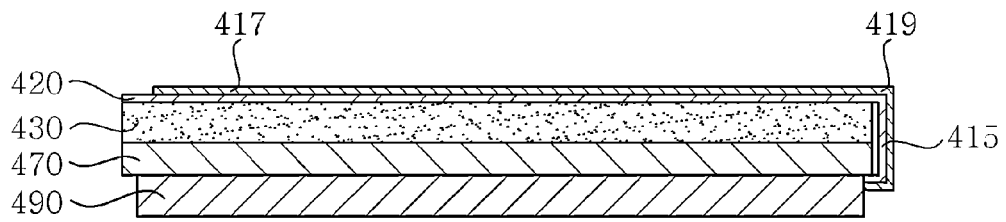
FIGS. 9A and 9B are a cross-sectional view and a perspective view of a touch panel according to a third preferred embodiment of the present invention.
Figure 9B:
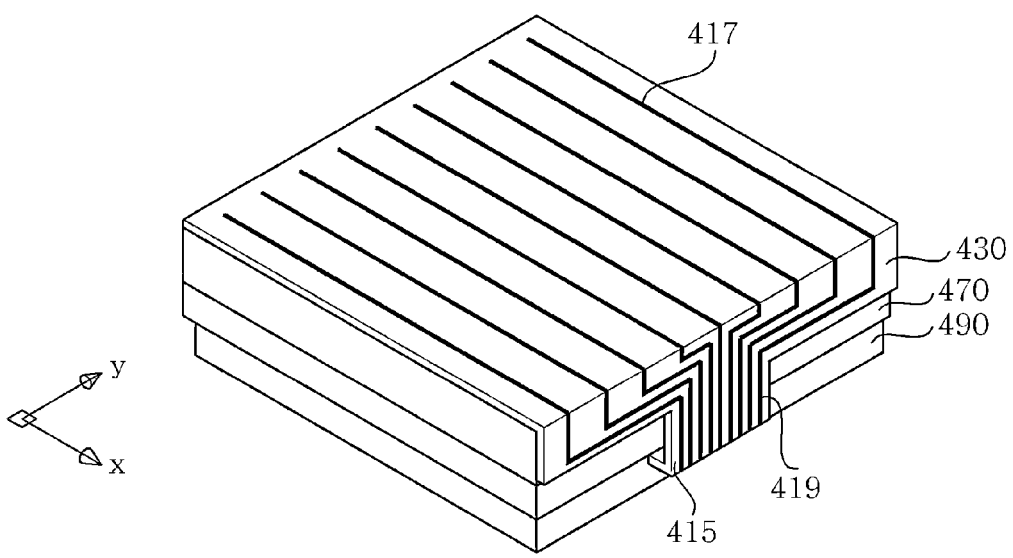
Figure 10A:
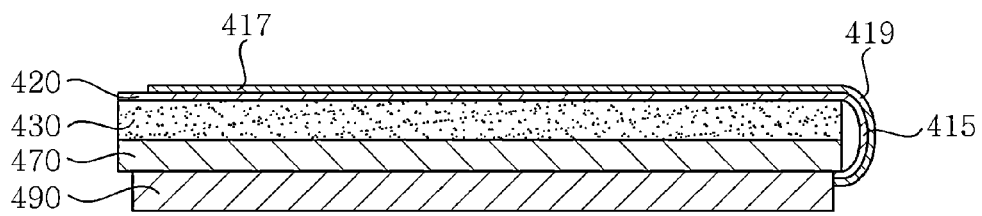
FIGS. 10A and 10B are a cross-sectional view and a perspective view of a touch panel according to another third preferred embodiment of the present invention.
Figure 10B:
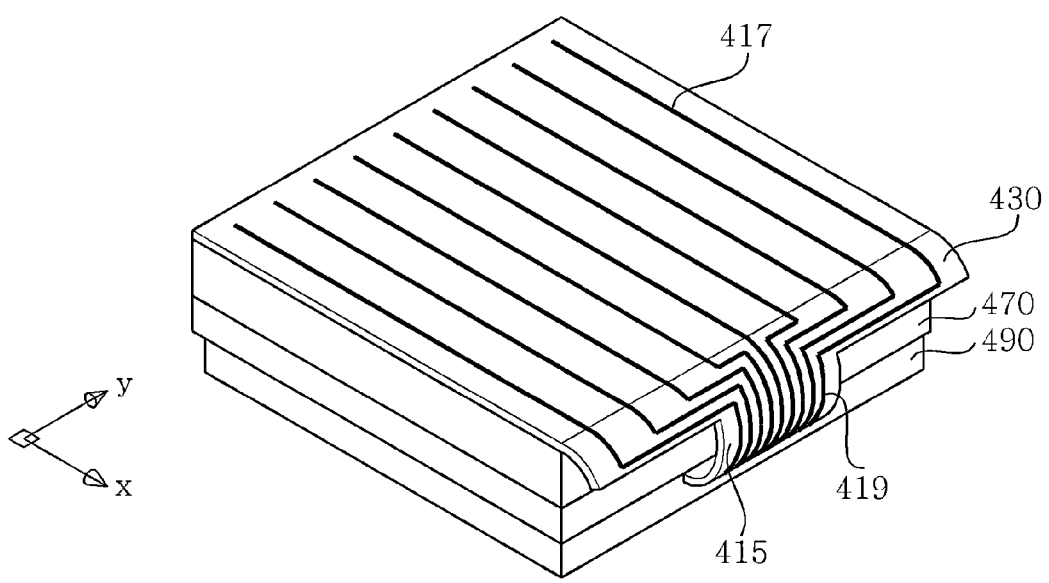
Figure 11:
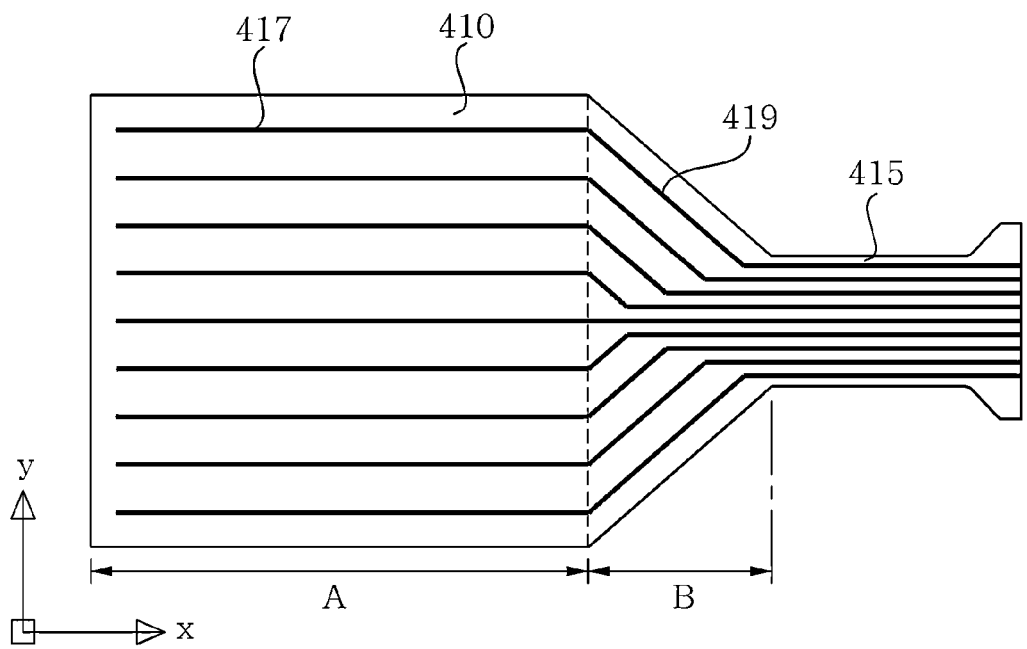
FIG. 11 is a plan view and a perspective view of a transparent substrate of a touch panel according to the third preferred embodiment of the present invention.
Figure 11:
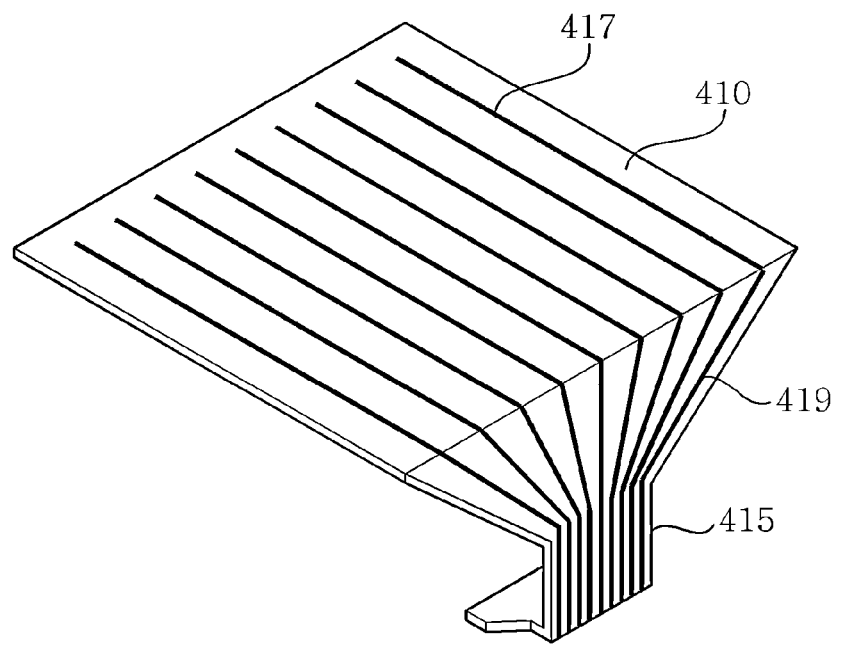

FIGS. 9A and 9B are a cross sectional view and a perspective view according to the third preferred embodiment of the present invention and FIGS. 10A and 10B are a cross-sectional view and a perspective view according to another third preferred embodiment of the present invention. FIG. 11 is a plan view and a perspective view of a transparent substrate of a touch panel according to the third preferred embodiment of the present invention.

The touch panel according to the third preferred embodiment of the present invention includes a transparent substrate 410, an extension part 415 protruded to extend from one side of the transparent substrate 410 so as to be integrally formed with the transparent substrate 410, metal electrodes 417 formed on the transparent substrate 410, and electrode wirings 419 extending from the metal electrode 417 so as to be formed on the transparent substrate 410 and the extension part 415, wherein the transparent substrate 410 is divided into the active region A and the inactive region B and the inactive region B and the transparent substrate 410 is bent at a boundary line between the active region A and the inactive region B of the transparent substrate 410 so that the inactive region B of the transparent substrate 410 and the extension part 415 may be vertically disposed to the active region A of the transparent substrate 410.

Hereinafter, the detailed description of the overlapping components and effects as the first and second preferred embodiments will be omitted.

Referring to FIG. 11, the transparent substrate 410 serve to provide a region in which the metal electrodes 417 and the electrode wirings 419 are formed. The transparent substrate 410 is divided into the active region A and the inactive region B, wherein the active region A is a portion in which the metal electrode 417 is formed so as to recognize the touch of the input unit and occupies most of the transparent substrate 410. In addition, the inactive region B is a portion in which the electrode wirings 419 extending from the metal electrodes 417 are formed and is disposed on one side of the transparent substrate 410.

The transparent substrate 410 configuring the touch panel may be configured of the flexible transparent film as in the preferred embodiment described above. The extension part 415 using the flexible transparent film, formed to be protruded from the inactive region of the transparent substrate 410, and serving the flexible printed circuit (FPC) for electrical connection with the printed circuit board is integrally formed with the transparent substrate 410. The transparent substrate 410 may be changed in a design into various shapes due to the structural characteristics. As shown in FIG. 9B, the active region A and the inactive region of the transparent substrate 410 are vertically bent to each other or as shown in FIG. 10B, the active region A and the inactive region of the transparent substrate 410 may be smoothly curved at the boundary line therebetween. Due to the modification, the active region A of the touch panel may be more visually noticeably recognized by the user.

In addition, the electrode wirings 419 are formed at the edges of the metal electrodes 417 and the function and formation method thereof overlaps with the above-mentioned preferred embodiments and therefore, the detailed description thereof will be omitted.

In addition, it is previously described that the image display device 470 is attached on one surface of the transparent substrate 410, one side of the image display device 470 is formed with the controller 490, and the extension part 415 is connected to the printed circuit board formed in the controller 490. An adhesive layer 430 may be applied to one surface of the transparent substrate 410 to reinforce the adhesion with the image display device 470. Herein, as the adhesive layer 430, various transparent adhesives such as an optical composite adhesive (OCA) may be used.

In particular, despite the name thereof, as the metal electrodes used in the first to third preferred embodiments of the present invention, the transparent electrode or a metal mesh electrode may be used. In addition, it can be appreciated from those skilled in the art that both of the transparent electrode or the metal mesh electrode may be applied to a capacitive type, a resistive type, or the like, through the structural change of the transparent substrate and the metal electrodes and various changes in a design of the electrode type and the structural change may be made.

Hereinafter, the transparent electrode and the metal mesh electrode will be briefly described.

As the metal electrode, the transparent electrode or the metal mesh electrode may be used.

First, the transparent electrode is formed on one surface of the transparent substrate. Herein, the transparent electrode may be made of the conductive polymer, in detail, may be made of poly-3,4-ethylene dioxy thiophene/polystyrene sulfonate (PEDOT/PSS), polyaniline, polyacetylene, or polyphenyl vinylene, or the like. In addition, materials such as the indium-tin-oxide (ITO), the carbon nanotube that is the organic transparent electrode material, graphene, zinc oxide (ZnO), tin oxide (SnO2), or the like, may be used. In addition, it is apparent that those skilled in the art can be selected and changed into the transparent electrode made of various materials. The transparent electrode may be formed on the transparent substrate by a physical method such as a sputtering method, a vacuum deposition method, an ion plating method, or the like, or a chemical method such as a spray method, a dip method, a chemical vapor deposition (CVD) method, or the like, but the preferred embodiments of the present invention are not limited thereto.

The metal mesh electrode may be formed by radiating the radiation solution to a transparent substrate 11a by an electrospinning method. In this case, the radiation solution disperses the metal, the metal oxides, the conductive polymer, the carbon nanotube, the graphene, or a combination thereof as a solvent, together with a binder. In detail, the metal includes copper (Cu), aluminum (Al), gold (Au), silver (Ag), titanium (Ti), palladium (Pd), chromium (Cr) or a combination thereof and the metal oxide includes indium tin oxide (ITO), antimony tin oxide (ATO), aluminum zinc oxide (AZO), or a combination thereof. The conductive polymer includes the above-mentioned materials. Other methods for forming a metal mesh electrode by the electrospinning method are general and therefore, the detailed description thereof will be omitted. In addition, the formation of the metal mesh electrode may be formed by various methods, in addition to the electrospinning method. The description of the known method for forming the metal mesh electrode will be omitted.

As set forth above, the exemplary embodiments of the present invention can increase the substantial area of the active region by bending the inactive region to the side of the touch panel.

In addition, the exemplary embodiments of the present invention can integrate the touch panel with the FPC by integrally forming the extension part corresponding to the FPC according to the prior art with the transparent substrate, instead of the method according to the prior art that connects the separately disposed FPC to the transparent substrate.

Although the embodiment of the present invention has been disclosed for illustrative purposes, it will be appreciated that a touch panel according to the invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A touch panel, comprising:
a transparent substrate;
a first extension part extending to be protruded from one side of the transparent substrate so as to be integrally formed with the transparent substrate;
a first metal electrode formed on one surface of the transparent substrate;
a first electrode wiring extending from the first metal electrode so as to be formed on one surface of the transparent substrate and the first extension part;
a second extension part extending to be protruded from the other side of the transparent substrate so as to be integrally formed with the transparent substrate;
a second metal electrode formed on the other surface of the transparent substrate; and
a second electrode wiring extending from the second metal electrode so as to be formed on the other surface of the transparent substrate and the second extension part,
wherein the one surface of the transparent substrate is divided into a first active region and a first inactive region and is bent at a boundary line between the first active region and the first inactive region so that the first inactive region and the first extension part are vertically disposed to the first active region of the transparent substrate, and
the other surface of the transparent substrate is divided into a second active region and a second inactive region, the second active region corresponding to the first active region, and is bent at a boundary line between the second active region and the second inactive region so that the second inactive region and the second extension part are vertically disposed to the second active region of the transparent substrate,
wherein the first extension part extends to be protruded from the first inactive region so as to be integrally formed with the transparent substrate,
wherein the second extension part extends to be protruded from the second inactive region so as to be integrally formed with the transparent substrate.

2. The touch panel as set forth in claim 1, further comprising a controller, wherein the controller is connected to the first electrode wiring formed on the first extension part and the second electrode wiring formed on the second extension part.

3. The touch panel as set forth in claim 1, wherein the transparent substrate, the first extension part, and the second extension part are configured of a flexible transparent film.

4. The touch panel as set forth in claim 1, wherein the first metal electrode is formed in the first active region of the transparent substrate so that straight electrode lines are repeatedly disposed in parallel in one direction, and the second metal electrode is formed in the second active region of the transparent substrate so that straight electrode lines formed in a direction vertical to the first metal electrode are repeatedly disposed in parallel.

5. The touch panel as set forth in claim 1, wherein the first metal electrode or the second metal electrode is a metal mesh electrode.

* * * * *